(12) United States Patent
Kim et al.

(10) Patent No.: US 7,781,285 B2
(45) Date of Patent: Aug. 24, 2010

(54) SEMICONDUCTOR DEVICE HAVING VERTICAL TRANSISTOR AND METHOD OF FABRICATING THE SAME

(75) Inventors: Bong-Soo Kim, Seongnam-si (KR);
Kang-Yoon Lee, Seongnam-si (KR);
Dong-Gun Park, Seongnam-si (KR);
Jae-Man Yoon, Seoul (KR); Seong-Goo Kim, Seoul (KR); Hyeoung-Won Seo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 192 days.

(21) Appl. No.: 11/450,936

(22) Filed: Jun. 9, 2006

(65) Prior Publication Data

US 2007/0080385 A1    Apr. 12, 2007

(30) Foreign Application Priority Data

Oct. 10, 2005    (KR) ........................ 10-2005-0095044

(51) Int. Cl.
*H01L 21/8242* (2006.01)

(52) U.S. Cl. .................. 438/242; 438/243; 257/E21.643

(58) Field of Classification Search ............ 257/E21.66, 257/E21.643; 438/242, 243
See application file for complete search history.

(56) References Cited

U.S. PATENT DOCUMENTS 5,753,961 A * 5/1998 Tsuchiaki .................... 257/510
5,929,477 A * 7/1999 McAllister et al. .......... 257/306
6,027,975 A 2/2000 Hergenrother et al. ...... 438/268
6,987,043 B2 * 1/2006 Kujirai et al. ............... 438/243

FOREIGN PATENT DOCUMENTS

| KR | 10-1997-0053501 | 7/1997 |
| KR | 10-2000-0027650 | 5/2000 |
| KR | 10-2000-0055217 | 9/2000 |

OTHER PUBLICATIONS

Takato, Hiroshi, et al., "Impact of Surrounding Gate Transistor (SGT) for Ultra-High-Density LSI's," IEEE Transactions on Electron Devices, vol. 38, No. 3, Mar. 1991.

* cited by examiner

*Primary Examiner*—Matthew C Landau
*Assistant Examiner*—Vicki B Booker
(74) *Attorney, Agent, or Firm*—Mills & Onello, LLP

(57) ABSTRACT

There are provided a semiconductor device having a vertical transistor and a method of fabricating the same. The method includes preparing a semiconductor substrate having a cell region and a peripheral circuit region. Island-shaped vertical gate structures two-dimensionally aligned along a row direction and a column direction are formed on the substrate of the cell region. Each of the vertical gate structures includes a semiconductor pillar and a gate electrode surrounding a center portion of the semiconductor pillar. A bit line separation trench is formed inside the semiconductor substrate below a gap region between the vertical gate structures, and a peripheral circuit trench confining a peripheral circuit active region is formed inside the semiconductor substrate of the peripheral circuit region. The bit line separation trench is formed in parallel with the column direction of the vertical gate structures. A bit line separation insulating layer and a peripheral circuit isolation layer are formed inside the bit line separation trench and the peripheral circuit trench, respectively.

15 Claims, 19 Drawing Sheets

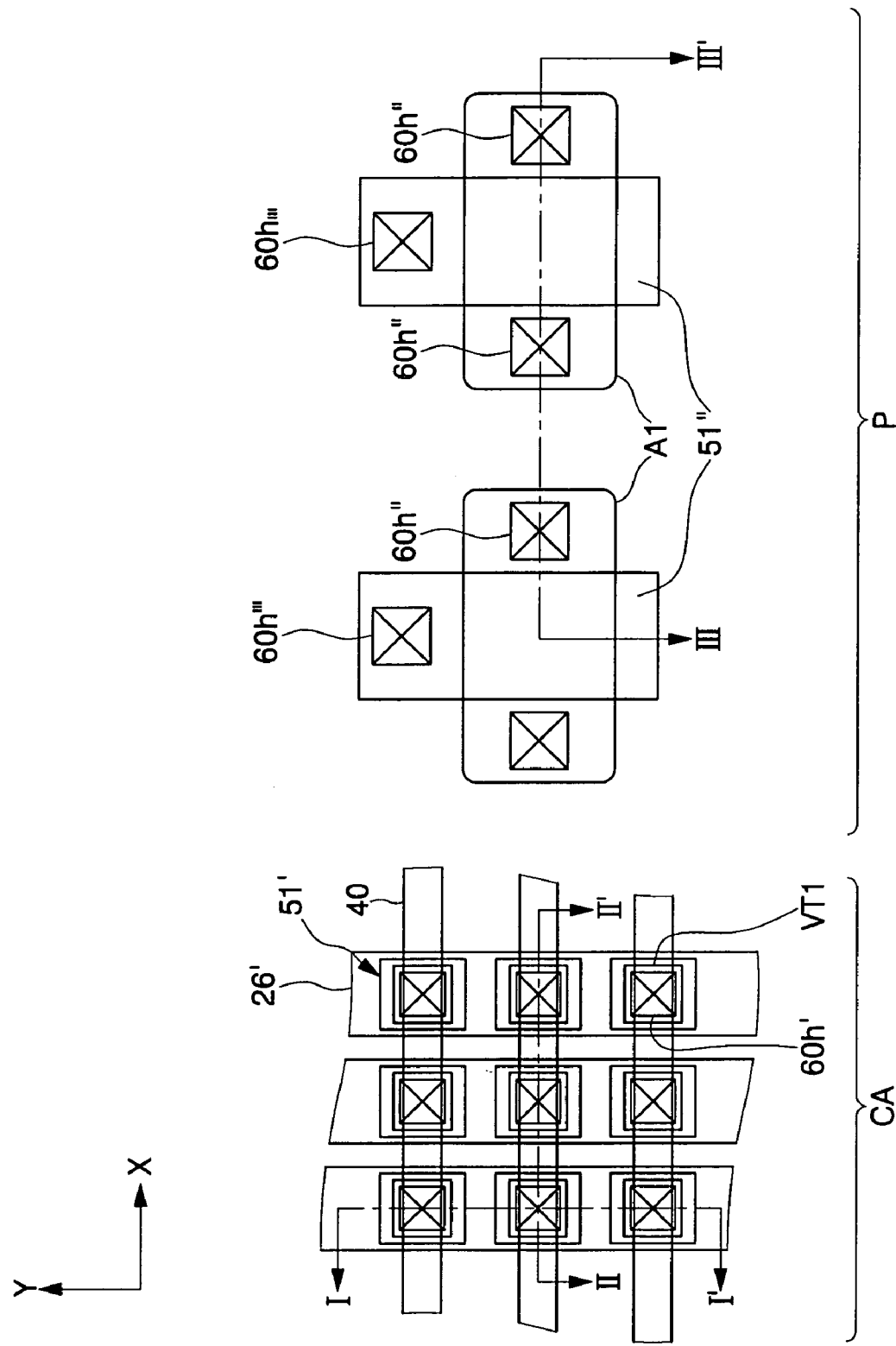

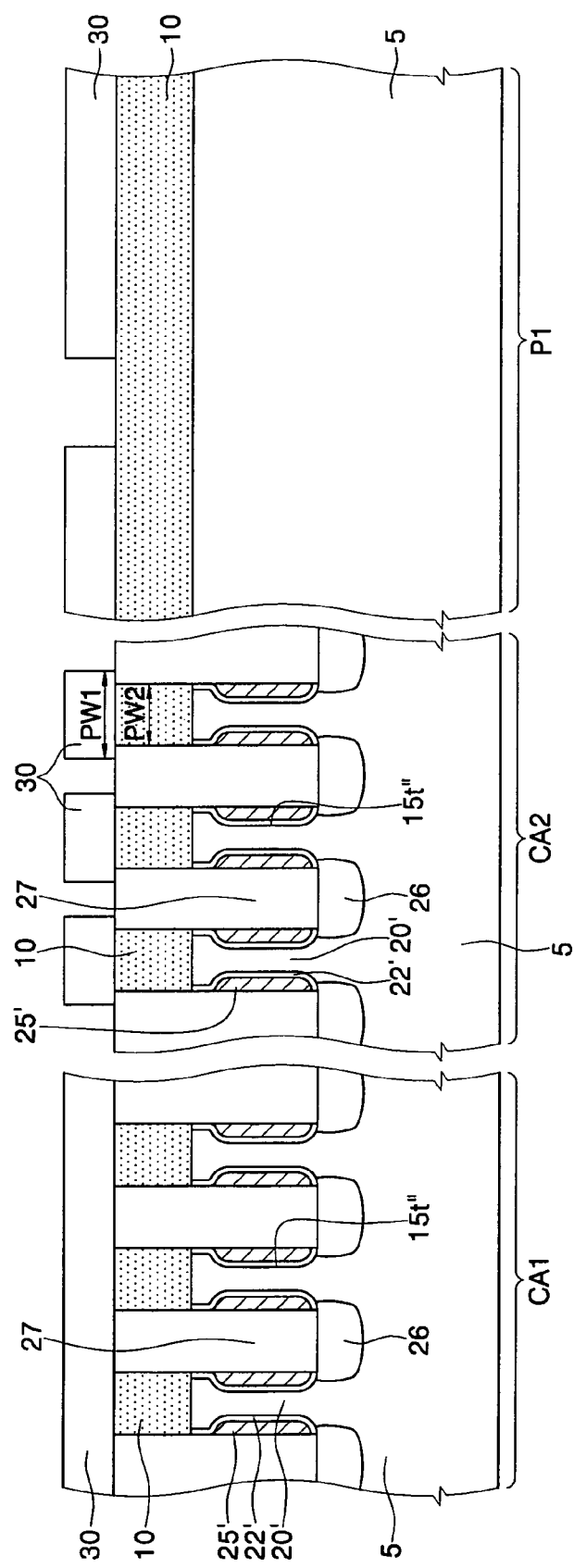

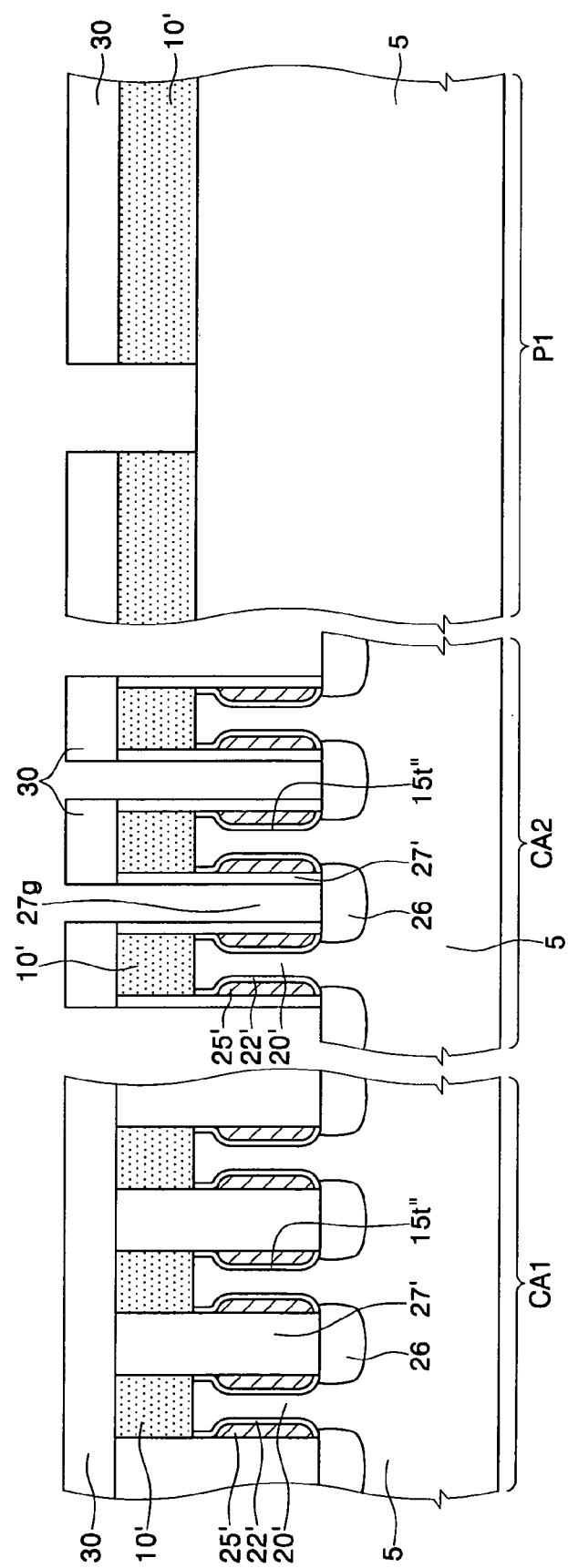

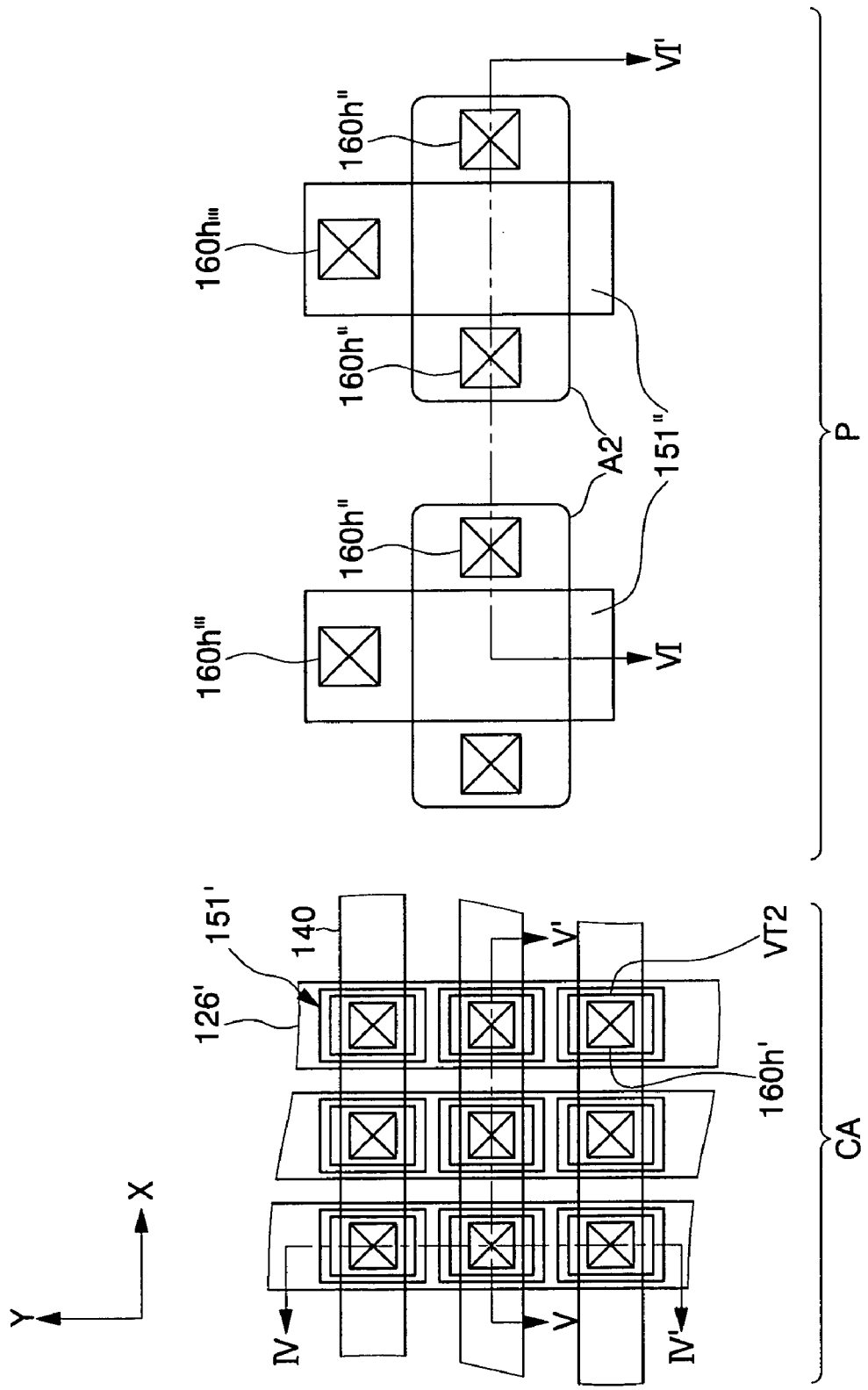

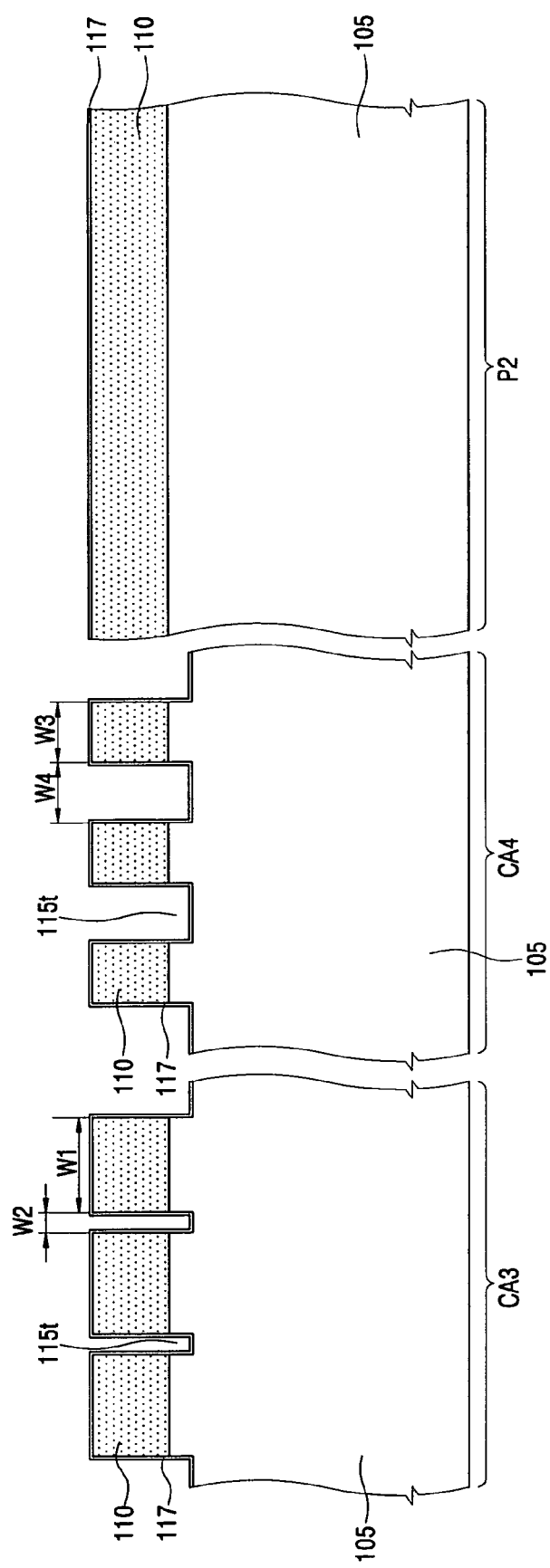

SEMICONDUCTOR DEVICE HAVING VERTICAL TRANSISTOR AND METHOD OF FABRICATING THE SAME

CROSS-REFERENCE TO RELATED APPLICATION

This application claims priority from Korean Patent Application No. 10-2005-0095044, filed in the Korean Intellectual Property Office on Oct. 10, 2005, the contents of which are hereby incorporated herein by reference in their entirety as if set forth fully herein.

BACKGROUND OF INVENTION

1. Technical Field

The present invention relates to a semiconductor device and a method of fabricating the same, and more particularly, to a semiconductor device having a vertical transistor, and a method of fabricating the same.

2. Discussion of the Related Art

With an increase in integration density of a semiconductor memory device such as a DRAM device, the area of a memory device formed on a wafer is reduced, and respective areas occupied by a transistor and a capacitor are reduced at a predetermined ratio. An essential component element of the semiconductor memory device is a memory element capable of storing one bit data, that is, a memory cell. The DRAM comprises several cells, each cell composed of one transistor and one capacitor, and a peripheral circuit capable of reading and writing to store data to the cell.

Currently, a transistor of the DRAM device is formed as a planar transistor. When integration density of the semiconductor memory device is increased, a planar area occupied by the transistor of the DRAM device is reduced. Hence, a channel length of the planar transistor is reduced, which results in a short channel effect. As a result, leakage current of the DRAM cell is increased so that refresh characteristics of the DRAM device may be degraded.

A DRAM cell having a vertical transistor capable of increasing integration density of the DRAM device and preventing a short channel effect phenomenon of the transistor is disclosed by H. Takato, et. al. in an article entitled, "Impact of Surrounding Gate Transistor(SGT) for Ultra-high Density LSI's" (IEEE Transactions on Electron Devices, March 1991, pp. 573-577).

In the article, the surrounding gate transistor is disposed vertically from a semiconductor substrate. The surrounding gate transistor is structured such that a semiconductor pillar is disposed protruded from the semiconductor substrate, and source and drain regions are disposed in an upper portion and a lower portion of the semiconductor pillar, respectively. A gate electrode is disposed to surround the semiconductor pillar, and a gate insulating layer is interposed between the gate electrode and the semiconductor pillar. A channel region is disposed vertically inside the semiconductor pillar. The surrounding gate transistor may be called a vertical transistor.

Further, a method of fabricating a DRAM cell having such a vertical transistor is disclosed in U.S. Pat. No. 6,027,975, entitled, "Process for fabricating vertical transistors".

However, the article and the U.S. Pat. No. 6,027,975 disclose only a vertical transistor (surrounding gate transistor) in a cell region. In order to fabricate a DRAM device using the vertical transistor, several cells, each composed of one transistor and one capacitor, and a peripheral circuit capable of reading and writing data to the cells as described above are prepared. Thus, it is necessary to consider processes for forming elements in a peripheral circuit region.

When a peripheral circuit transistor of the elements of the peripheral circuit region is formed concurrently with a vertical transistor in the cell region, and thus, is formed as a peripheral circuit vertical transistor, processes may be shortened, and production costs can be reduced. However, since the peripheral circuit vertical transistor is degraded in its device characteristics compared to the planar transistor, the peripheral circuit vertical transistor may not provide the performance characteristics as high as required for the device characteristics of a peripheral circuit transistor.

Therefore, it is necessary to form a vertical transistor in the cell region, and to maintain a planar transistor in the peripheral circuit region. In this case, a vertical transistor may be formed in the cell region first, and then a planar transistor may be formed in the peripheral circuit region. The method may have a problem that the number of processes is increased. Therefore, it is required to study the method of shortening the number of processes to form a vertical transistor and a planar transistor in the cell region and the peripheral circuit region, respectively.

SUMMARY OF THE INVENTION

Therefore, the present invention is directed to a semiconductor device having a vertical transistor and a method of fabricating the same suitable to reducing the number of processes to form a vertical transistor and a planar transistor in a cell region and a peripheral circuit region, respectively.

In accordance with a first aspect, the present invention provides a semiconductor device having a vertical transistor. The semiconductor device includes a semiconductor substrate having a cell region and a peripheral circuit region. A vertical transistor is disposed in the semiconductor substrate of the cell region. A contact pad is disposed on the vertical transistor. A peripheral circuit gate electrode is disposed on the semiconductor substrate of the peripheral circuit region, and is composed of the same material as that of the contact pad.

In exemplary embodiments of the present invention, the contact pad and the peripheral circuit gate electrode may be a polysilicon layer and a metal silicide layer, which are sequentially stacked.

Further, the vertical transistor may include a semiconductor pillar extending from the semiconductor substrate, source and drain regions being disposed in an upper portion and a lower portion of the semiconductor pillar, respectively, a cell gate electrode surrounding a center portion of the semiconductor pillar, and a cell gate insulating layer interposed between the semiconductor pillar and the cell gate electrode.

Further, peripheral circuit source and drain regions may be disposed inside the semiconductor substrate at both sides of the peripheral circuit gate electrode.

Further, an interlayer insulating layer may be disposed on the substrate having the contact pad and the peripheral circuit gate electrode, and a buried contact plug and peripheral circuit contact plugs may be disposed through the interlayer insulating layer so as to be electrically connected to the contact pad and the peripheral circuit source and drain regions. A cell capacitor may be disposed on the substrate having the buried contact plug and electrically connected to the buried contact plug.

In another aspect of the present invention, the present invention provides a method of fabricating a semiconductor device having a vertical transistor. The method includes preparing a semiconductor substrate having a cell region and a peripheral circuit region. Island-shaped vertical gate structures two-dimensionally aligned along a row direction and a column direction are formed on the substrate of the cell region. Each of the vertical gate structures includes a semiconductor pillar and a gate electrode surrounding a center portion of the semiconductor pillar. A bit line separation trench is formed inside the semiconductor substrate below a gap region between the vertical gate structures, and a peripheral circuit trench is formed confining a peripheral circuit active region is formed inside the semiconductor substrate of the peripheral circuit region, and the bit line separation trench is formed in parallel with the column direction of the vertical gate structures. A bit line separation insulating layer and a peripheral circuit isolation layer are formed inside the bit line separation trench and the peripheral circuit trench, respectively.

In exemplary embodiments of the present invention, the forming of the vertical gate structures may include etching the semiconductor substrate of the cell region by a predetermined depth, thereby forming an island-shaped preliminary semiconductor pillar two-dimensionally aligned along a row direction and a column direction on the substrate of the cell region. Then, a lower portion of the preliminary semiconductor pillar may be selectively etched isotropically, thereby forming a semiconductor pillar, and an upper width of the semiconductor pillar may be formed greater than a lower width thereof. A cell gate electrode layer filling a gap region between the semiconductor pillars may be formed. The cell gate electrode layer may be etched unisotropically, thereby forming a cell gate electrode surrounding a sidewall of the semiconductor pillar.

Further, before forming the bit line separation trench and the peripheral circuit trench, an impurity region may be formed inside the semiconductor substrate below the gap region between the vertical gate structures of the cell region. The impurity region may be separated by the bit line separation trench during the formation of the bit line separation trench and the peripheral circuit trench, thereby forming a drain region.

Further, before forming the vertical gate structures, a surface impurity region may be formed on a surface of the semiconductor substrate of the cell region. The surface impurity region may be separated during the formation of the vertical gate structures, and may remain inside upper portions of the vertical gate structures so as to function as a source region.

Further, after forming the word line, a source region may be formed inside an upper portion of the semiconductor pillar.

Further, the gap region between the vertical gate structures may include a first gap region between the vertical gate structures aligned along the row direction and a second gap region between the vertical gate structures aligned along the column direction, and the first gap region may be formed to have a greater width than that of the second gap region. The forming of the bit line separation trench and the peripheral circuit trench may include forming a spacer covering sidewalls of the first gap region, and a spacer layer pattern filling the second gap region. The semiconductor substrate below the first gap region on which the spacer is formed and a predetermined portion of the semiconductor substrate of the peripheral circuit region may be etched. The forming of the bit line separation insulating layer and the peripheral circuit isolation layer may include forming an isolation insulating layer on the substrate having the bit line separation trench and the peripheral circuit trench. The isolation insulating layer is planarized until upper surfaces of the vertical gate structures and an upper surface of the semiconductor substrate of the peripheral circuit region are exposed, thereby forming a peripheral circuit isolation layer in the peripheral circuit region. Then, the planarized isolation insulating layer on the bit line separation trench, and the spacer may be selectively etched, thereby forming a bit line separation insulating layer covering the bit line separation trench and extending to a portion between the vertical gate structures.

Further, the forming of the bit line separation trench and the peripheral circuit trench may include forming a mask insulating layer filling a gap region between the vertical gate structures. Then, the mask insulating layer may be selectively etched, thereby forming a mask insulating layer groove exposing the semiconductor substrate below the gap region between the vertical gate structures in a column direction. The semiconductor substrate exposed by the mask insulating layer groove and a predetermined portion of the semiconductor substrate of the peripheral circuit region may be etched. The forming of the bit line separation insulating layer and the peripheral circuit isolation layer may include forming an isolation insulating layer on the substrate having the bit line separation trench and the peripheral circuit trench. The isolation insulating layer may be planarized until upper surfaces of the vertical gate structures and an upper surface of the semiconductor substrate of the peripheral circuit region are exposed, thereby forming a peripheral circuit isolation layer in the peripheral circuit region. The planarized isolation insulating layer and the mask insulating layer on the bit line separation trench may be selectively etched, thereby forming a bit line separation insulating layer covering the bit line separation trench, and extending to and filling a predetermined portion between the vertical gate structures.

Further, the bit line separation trench may be formed to have a smaller width than a distance between the vertical gate structures aligned along the row direction.

Further, after forming the bit line separation insulating layer and the peripheral circuit isolation layer, the method may further include forming an insulating layer filling the gap region between the vertical gate structures. Then, a conductive layer may be formed on the substrate having the insulating layer. The conductive layer may be patterned, thereby forming contact pads covering respective upper surfaces of the vertical gate structures, and a peripheral circuit gate electrode crossing the peripheral circuit active region on the semiconductor substrate of the peripheral circuit region. Before forming an insulating layer filling the gap region between the vertical gate structures, the method may further include forming a word line crossing the bit line separation insulating layer between the vertical gate structures, and being electrically connected to the gate electrode. By implanting impurity ions into the semiconductor substrate, using the contact pads and the peripheral circuit gate electrode as ion implantation masks, peripheral circuit source and drain regions may be formed inside the semiconductor substrate of the peripheral circuit region. An interlayer insulating layer may be formed on the substrate having the peripheral circuit source and drain regions. Then, buried contact plugs and peripheral circuit contact plugs may be formed through the interlayer insulating layer so as to be electrically connected to the contact pads and the peripheral circuit source and drain regions, respectively. Cell capacitors electrically connected to the buried contact plugs respectively may be formed on the substrate having the buried contact plugs.

In accordance with another exemplary embodiment, the present invention provides a method of fabricating a semiconductor device having a vertical transistor. The method includes preparing a semiconductor substrate having a cell region and a peripheral circuit region. Island-shaped vertical transistors are formed in the semiconductor substrate of the cell region. A contact pad is formed on the vertical transistors and a peripheral circuit gate electrode is formed on the semiconductor substrate of the peripheral circuit region, and the peripheral circuit gate electrode is formed of the same material as that of the contact pad.

In exemplary embodiments of the present invention, each of the vertical transistors may be formed to include a semiconductor pillar extending from the semiconductor substrate, source and drain regions being disposed in an upper portion and a lower portion of the semiconductor pillar, respectively, a cell gate electrode surrounding a center portion of the semiconductor pillar, and a cell gate insulating layer interposed between the semiconductor pillar and the cell gate electrode.

Further, the forming of the contact pad and the peripheral circuit gate electrode may include forming an insulating layer filling a gap region between the vertical transistors. Then, a conductive layer may be formed on the substrate having the insulating layer. The conductive layer may be patterned, thereby forming contact pads covering respective upper surfaces of the vertical transistors, and a peripheral circuit gate electrode on the semiconductor substrate of the peripheral circuit region.

Further, by implanting impurity ions into the semiconductor substrate, using the contact pads and the peripheral circuit gate electrode as ion implantation masks, peripheral circuit source and drain regions may be formed inside the semiconductor substrate of the peripheral circuit region. An interlayer insulating layer may be formed on the substrate having the peripheral circuit source and drain regions. Buried contact plugs and peripheral circuit contact plugs may be formed through the interlayer insulating layer so as to be electrically connected to the contact pads and the peripheral circuit source and drain regions, respectively. Cell capacitors electrically connected to the buried contact plugs respectively may be formed on the substrate having the buried contact plugs.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 1 is a plan view illustrating a semiconductor device according to embodiments of the present invention.

FIGS. 2A through 2L are sectional views taken along lines I-I', II-II', and III-III' of FIG. 1.

FIG. 3 is a plan view illustrating a semiconductor device according to another embodiments of the present invention.

FIGS. 4A through 4E are sectional views taken along lines IV-IV', V-V', and VI-VI' of FIG. 3.

DETAILED DESCRIPTION OF THE INVENTION

Figure 2A:
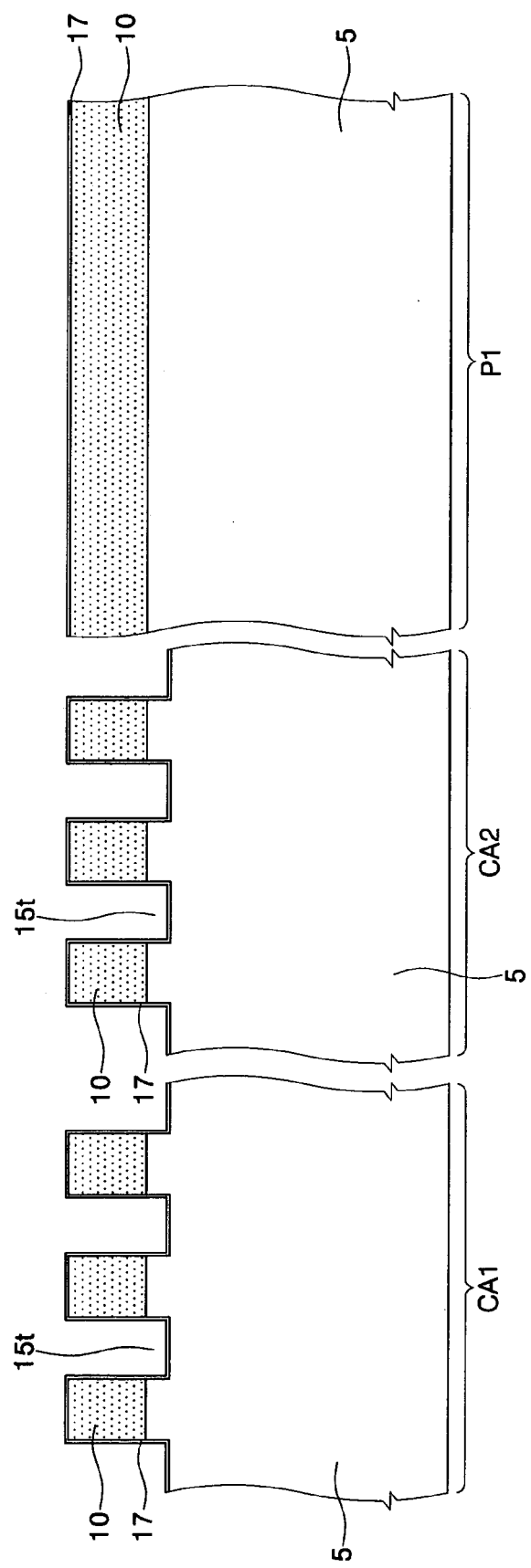

FIG. 1 is a plan view illustrating a semiconductor device according to embodiments of the present invention, and FIGS. 2A through 2L are sectional views taken along lines I-I', II-II', and III-III' of FIG. 1, illustrating steps in a process of fabricating the device of FIG. 1, according to one embodiment of the invention.

Reference characters 'CA' and 'P' of FIG. 1 represent a cell region and a peripheral circuit region, respectively, and reference characters 'CA1 ', 'CA2' and 'P1' of FIGS. 2A through 2L represent sectional views taken along lines I-I', II-II' and III-III' of FIG. 1, respectively.

Referring to FIGS. 1 and 2A, a semiconductor substrate 5 having a cell region CA and a peripheral circuit region P is prepared. A mask layer is formed on the semiconductor substrate 5. The mask layer may be formed of a pad oxide layer and a pad nitride layer, which are sequentially stacked. The mask layer is patterned, thereby forming a first mask pattern 10 having an island-shaped pattern two-dimensionally aligned along a row direction X and a column direction Y on the semiconductor substrate 5 of the cell region CA. The first mask pattern 10 of the peripheral circuit region P is formed to cover all the semiconductor substrate 5 of the peripheral circuit region P. Using the first mask pattern 10 as an etch mask, the semiconductor substrate 5 of the cell region CA is etched, thereby forming a first trench 15t. Then, a conformal protecting layer 17 is formed on the first-etched semiconductor substrate 5. The protecting layer 17 may be a silicon nitride layer or a silicon oxynitride layer.

Figure 2B:
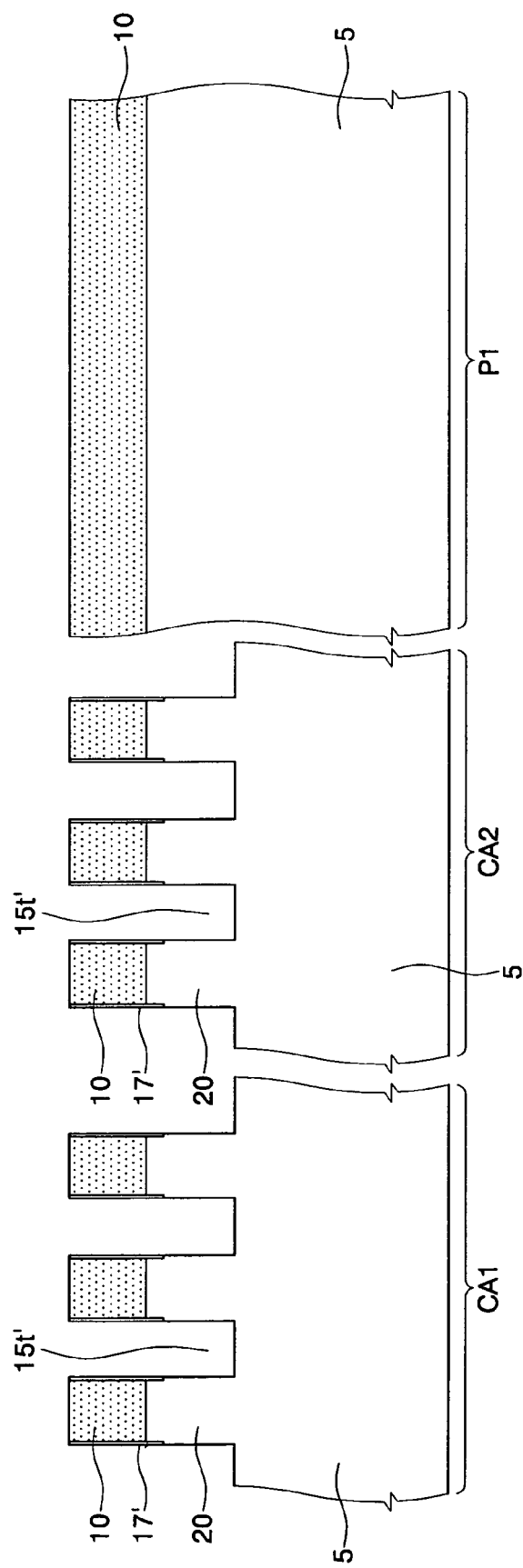

Referring to FIGS. 1 and 2B, an etch-back process may be performed on the protecting layer 17, thereby forming a protecting spacer 17'. Then, using the first mask pattern 10 and the protecting spacer 17' as etch masks, the semiconductor substrate 5 is secondly etched, thereby forming a second trench 15t', which is etched more deeply than the first trench 15t. A preliminary semiconductor pillar 20 is formed below the first mask pattern 10 of the cell region CA by the second trench 15t'.

Figure 2C:
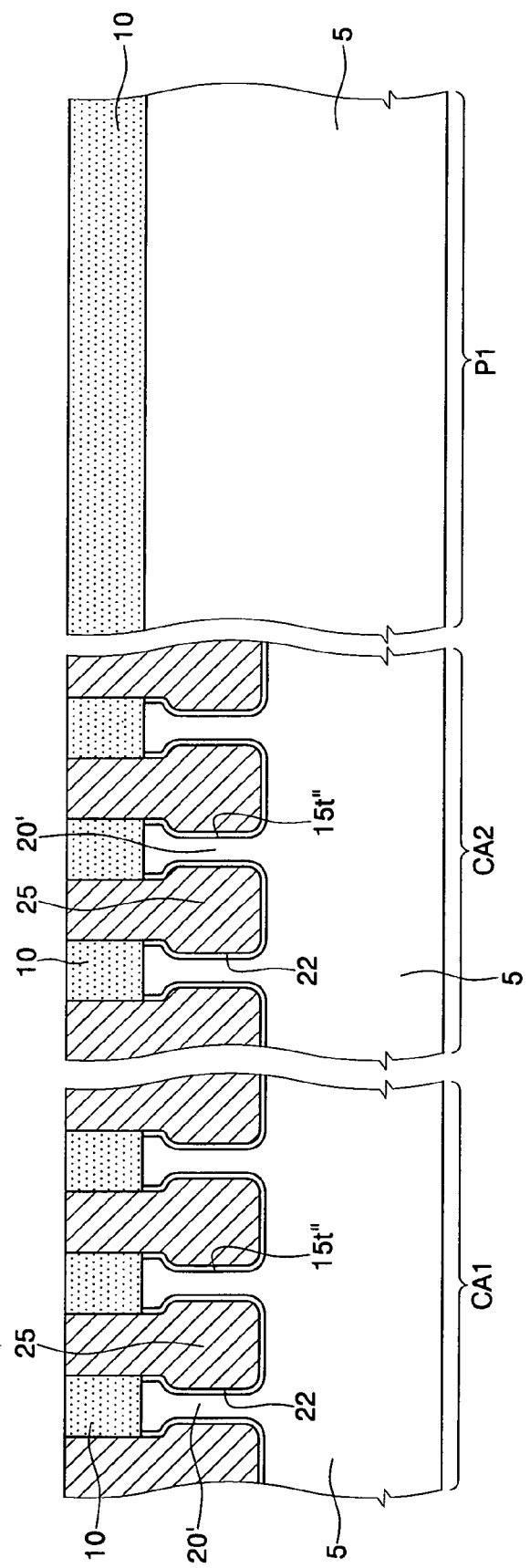

Referring to FIGS. 1 and 2C, the substrate having the preliminary semiconductor pillar 20 is isotropically etched. As a result, a lower portion of the protecting spacer 17' of the preliminary semiconductor pillar 20 is isotropically etched, thereby forming a semiconductor pillar 20' and a third trench 15t" having a greater width in its lower portion. Then, the protecting spacer 17' may be removed.

The substrate having the semiconductor pillar 20' may be thermally oxidized, thereby forming a cell gate insulating layer 22 surrounding an inner wall of the third trench 15t'. After a cell gate electrode layer is formed on the substrate having the cell gate insulating layer 22, the cell gate electrode layer is planarized until an upper surface of the first mask pattern 10 is exposed, thereby forming a planarized cell gate electrode layer 25. The cell gate electrode layer 25 may be a polysilicon layer.

Referring to FIGS. 1 and 2D, using the first mask pattern 10 as an etch mask, the planarized cell gate electrode layer 25 is unisotropically etched until a bottom of the third trench 15t'" is exposed. As a result, a cell gate electrode 25' surrounding a sidewall of the semiconductor pillar 20' is formed. The cell gate insulating layer 22 may be concurrently patterned, thereby forming a patterned cell gate insulating layer 22'. The semiconductor pillar 20' and the cell gate electrode 25' may constitute a vertical gate structure.

Impurity ions are implanted into the substrate having the cell gate electrode 25', thereby forming an impurity region 26 inside the semiconductor substrate 5 below the exposed third trench 15t'". A mask insulating layer 27 filling the third trench 15t'" is formed on the substrate having the impurity region 26. Then, a first photoresist layer is formed on the substrate having the mask insulating layer 27. The first photoresist layer is patterned so as to selectively expose the mask insulating layer 27 along a column direction, thereby forming a first photoresist pattern 30 exposing a predetermined portion of the first mask pattern 10 of the peripheral circuit region P.

A width PW1 of the first photoresist pattern 30 formed on the cell region CA may be preferably greater than a width PW2 of the first mask pattern 10 in a transverse direction.

Referring to FIGS. 1 and 2E, using the first photoresist pattern 30 as an etch mask, the mask insulating layer 27 of the cell region CA and the first mask pattern 10 of the peripheral circuit region P are etched. Using one first photoresist pattern 30, the mask insulating layer 27 and the first mask pattern 10 are etched using various etch gases. As a result, a mask insulating layer groove 27g partially exposing a bottom of the third trench 15t" is formed in the cell region CA, and a mask insulating layer pattern 27' is formed on a sidewall of the mask insulating layer groove 27g to fill a portion between the semiconductor pillars in a longitudinal direction. Further, a second mask pattern 10' exposing a predetermined portion of the semiconductor substrate 5 in the peripheral circuit region P is formed.

Figure 2F:
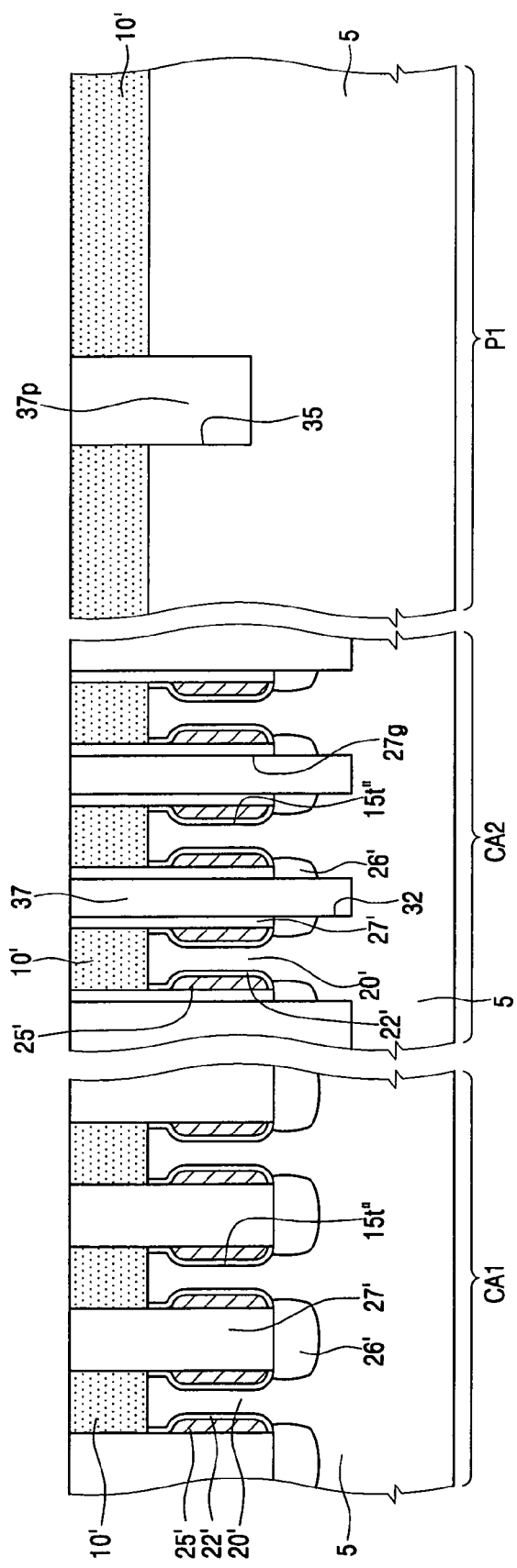

Referring to FIGS. 1 and 2F, the first photoresist pattern 30 may be removed. Then, using the second mask pattern 10' and the mask insulating layer pattern 27' as etch masks, the semiconductor substrate 5 is etched. As a result, a bit line separation trench 32 is formed in the cell region CA, and a peripheral circuit trench 35 is formed in the peripheral circuit region R The impurity region 26 of the cell region CA is separated by the bit line separation trench 32, thereby forming drain regions 26'. The drain regions 26' function as bit lines.

After an isolation insulating layer is formed on the substrate having the drain regions 26', the isolation insulating layer is planarized until an upper surface of the second mask pattern 10' is exposed. As a result, a planarized isolation insulating layer 37 is formed inside the bit line separation trench 32 and the mask insulating layer groove 27g. Further, a peripheral circuit isolation layer 37p is formed inside the peripheral circuit trench 35. The isolation insulating layer may be formed of the same material as that of the mask insulating layer pattern 27'. The isolation insulating layer may be a silicon oxide layer.

Figure 2G:
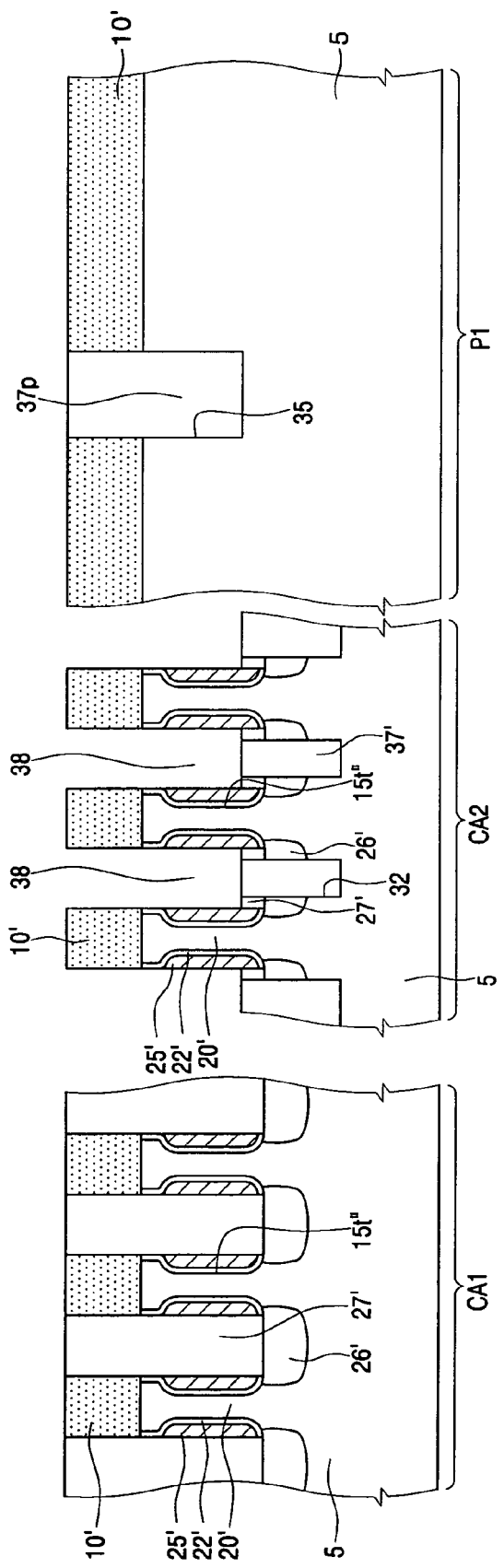

Referring to FIGS. 1 and 2G, a second photoresist layer is formed on the substrate having the planarized isolation insulating layer 37. Then, the second photoresist layer may be patterned, thereby forming a second photoresist pattern crossing the drain regions 26' of the cell region CA, and exposing the second mask patterns 10', the mask insulating layer pattern 27', and the planarized isolation insulating layer 37. Then, using the second photoresist pattern and the second mask patterns 10' as etch masks, the mask insulating layer pattern 27' and the planarized isolation insulating layer 37 are etched with a predetermined depth, thereby forming word line trenches 38 exposing a sidewall of the cell gate electrode 25'. The mask insulating layer pattern 27' is at least partially remaining. When the word line trenches 38 are formed, a bit line separation insulating layer 37' is formed inside the bit line separation trench 32. Then, the second photoresist pattern may be removed.

Figure 2H:
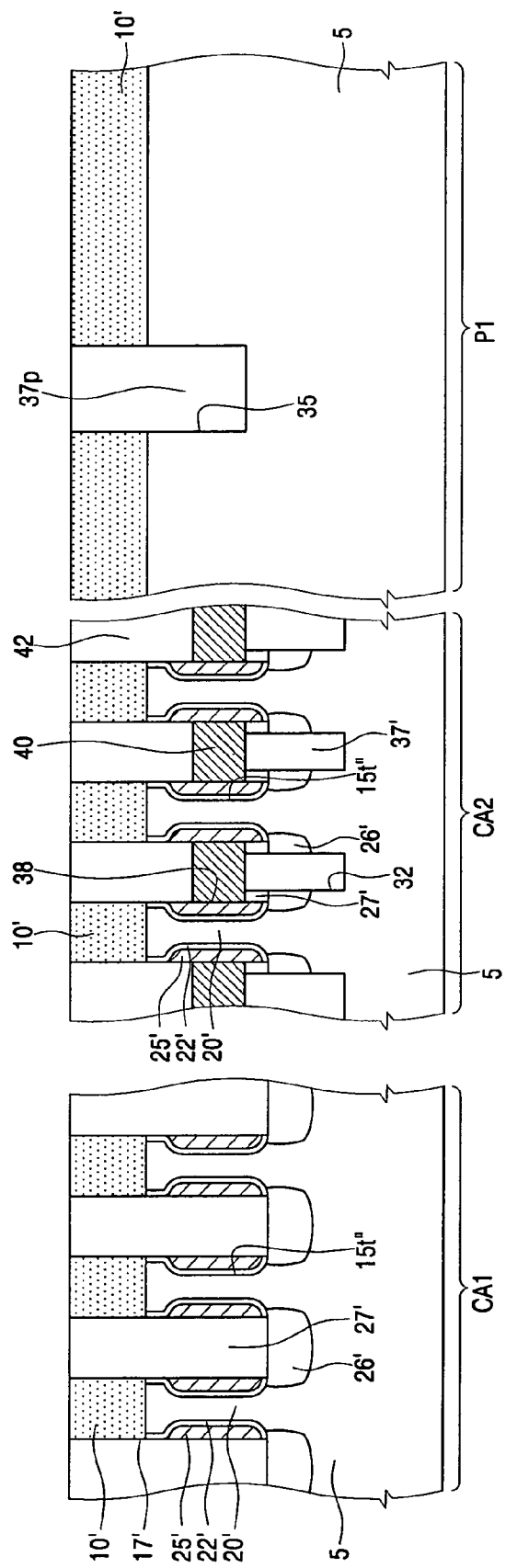
Figure 21:
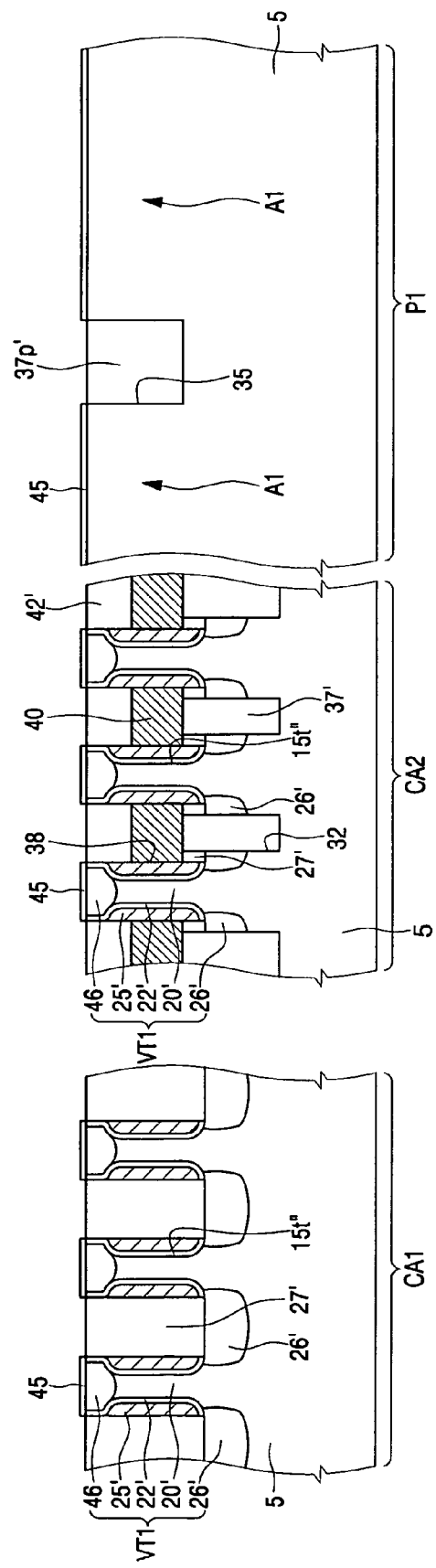

Referring to FIGS. 1 and 2H, a word line 40 is formed on the structure having the word line trenches 38 to fill a portion between the word line trenches 38 with a predetermined depth, and electrically contact with a sidewall of the cell gate electrode 25'. An insulating layer is formed on the substrate having the word line 40. Then, the insulating layer is planarized until the second mask pattern 10' is exposed, thereby forming a planarized insulating layer 42.

Referring to FIGS. 1 and 2I, the semiconductor substrate having the planarized insulating layer 42 is planarized until an upper surface of the semiconductor pillar 20' and an upper surface of the semiconductor substrate 5 of the peripheral circuit region P are exposed. In the planarization process, a chemical mechanical polishing (CMP) process and a dry etch process may be sequentially performed. The peripheral circuit isolation layer 37p of the peripheral circuit region P is concurrently planarized, thereby forming a final peripheral circuit isolation layer 37p' confining a peripheral circuit active region A1. Further, the second mask pattern 10' is removed, and the planarized insulating layer 42 is changed to an insulating layer 42' having the same level in height as that of an upper surface of the semiconductor pillar 20'.

A gate insulating layer 45 is formed on the planarized semiconductor substrate. The gate insulating layer 45 may be a thermal oxide layer. A third photoresist pattern covering the peripheral circuit region P is formed on the substrate having the gate insulating layer 45. Then, using the third photoresist pattern as a mask, impurity ions are implanted into the substrate having the gate insulating layer 45. As a result, source regions 46 may be formed inside the semiconductor pillars 20' of the cell region CA. Then, the third photoresist pattern is removed.

Alternatively, the source region 46 may be formed during the formation of the preliminary semiconductor pillar 20 in the operation illustrated in FIG. 2B. Specifically, before the mask layer is formed in the operation of FIG. 2A, impurity ions may be implanted into a surface of the semiconductor substrate 5 of the cell region CA, thereby forming a surface impurity region. Then, while the preliminary semiconductor pillar 20 is formed in the operation of FIG. 2B, the surface impurity region may be separated so as to form the source regions 46.

The semiconductor pillar 20', the cell gate insulating layer 22', the cell gate electrode 25', the drain region 26', and the source region 46 may constitute a vertical transistor VT1. Since a voltage is applied to the cell gate electrode 25' via the word line 40, and a channel is vertically formed inside the semiconductor pillar 20' between the source and drain regions 46 and 26' with the cell gate insulating layer 22' disposed therebetween adjacent to the cell gate electrode 25', the vertical transistor VT1 may have its element characteristics as it is.

Figure 2J:
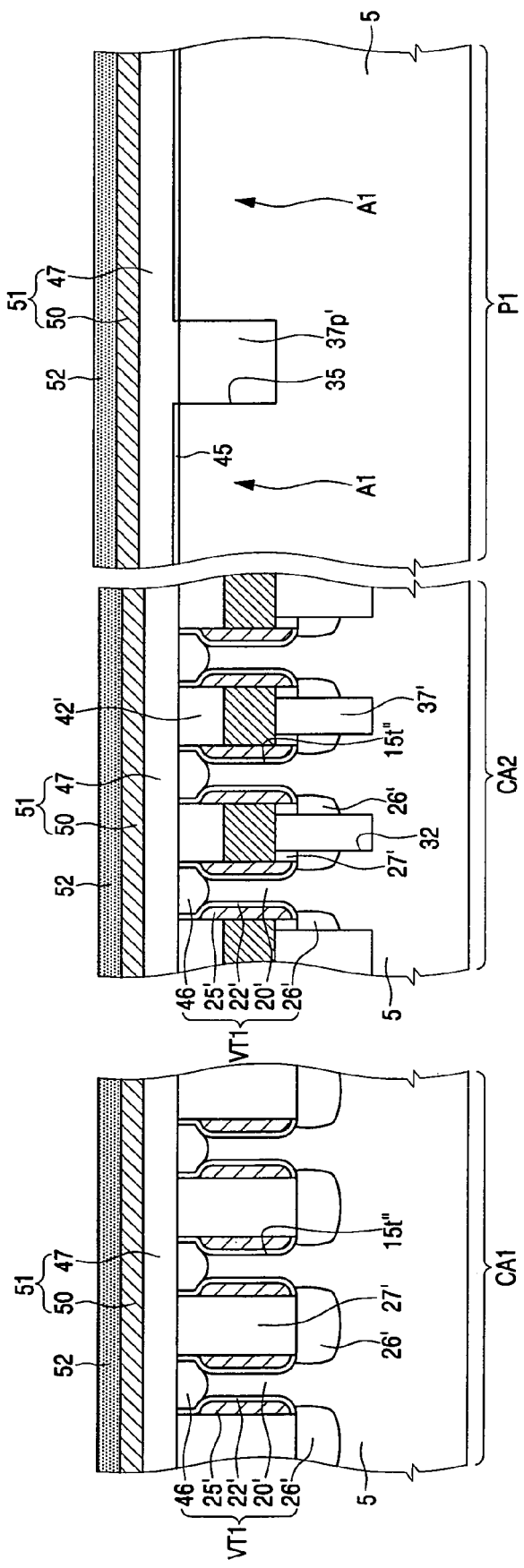

Referring to FIGS. 1 and 2J, a fourth photoresist pattern covering the peripheral circuit region P and the exposing the cell region CA may be formed on the substrate having the vertical transistors VT1. Then, using the fourth photoresist pattern as an etch mask, the gate insulating layer 45 exposed in the cell region CA may be removed so as to expose an upper surface of the semiconductor pillar 20'. Then, the fourth photoresist pattern is removed.

A conductive layer 51 and a gate mask layer 52 may be sequentially formed on the substrate, in which upper surfaces of the semiconductor pillars 20' are exposed. The conductive layer 51 may be formed by sequentially stacking a polysilicon layer 47 and a metal silicide layer 50. The metal silicide layer 50 may be a tungsten silicide layer.

Figure 2K:
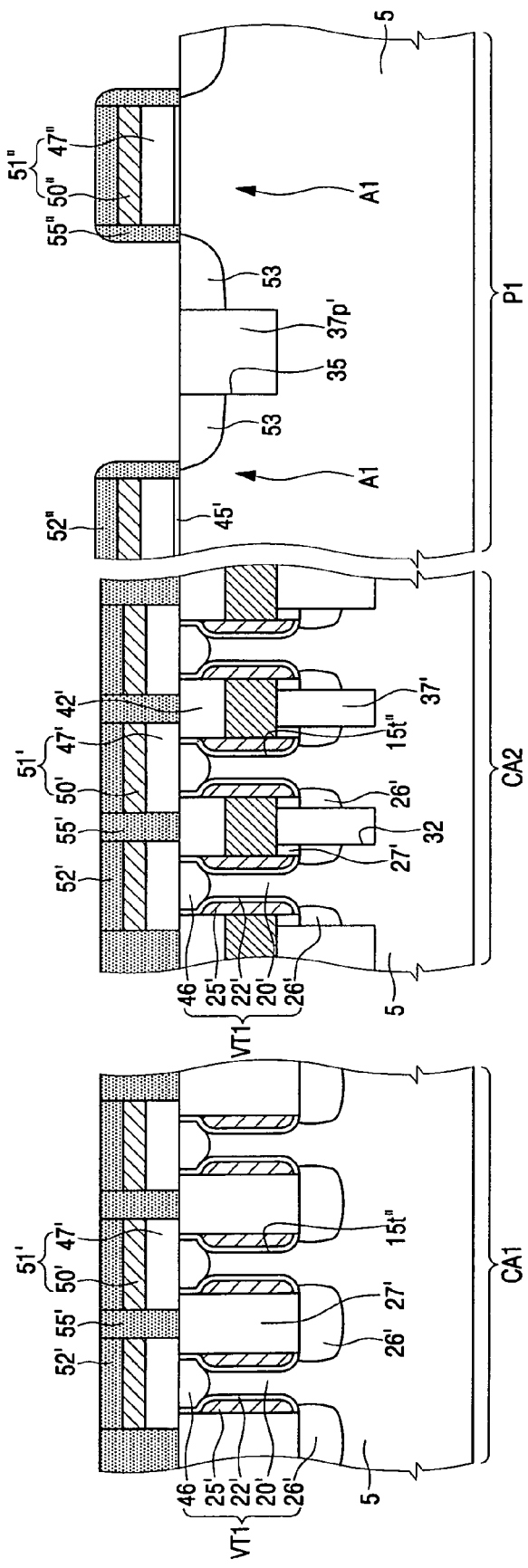

Referring to FIGS. 1 and 2K, the gate mask layer 52 and the conductive layer 51 may be sequentially patterned, thereby forming a contact pad 51' and a contact mask pattern 52' sequentially covering upper surfaces of the vertical transistors VT1, and forming a peripheral circuit gate electrode 51" and a gate mask pattern 52" sequentially stacked while crossing the peripheral circuit active region A1 on the semiconductor substrate 5 of the peripheral circuit region P. The contact pad 51' may be a polysilicon pattern 47' and a metal silicide pattern 50', which are sequentially stacked. Further, the peripheral circuit gate electrode 51" may be a polysilicon pattern 47" and a metal silicide pattern 50", which are sequentially stacked. Further, while the gate mask layer 52 and the conductive layer 51 are sequentially patterned, the gate insulating layer 45 of the peripheral circuit region P may be patterned. As a result, a peripheral circuit gate insulating layer 45' is formed.

A gate spacer layer may be formed on the substrate having the contact pads 51' and the peripheral circuit gate electrodes 51". The gate spacer layer may fill a portion between the contact pad 51' and the contact mask pattern 52', which are sequentially stacked. An etch-back process may be performed on the gate spacer layer, thereby forming a gate spacer 55" covering sidewalls of the peripheral circuit gate electrode 51" and the gate mask pattern 52" which are sequentially stacked, and forming a gate spacer layer pattern 55' filling a portion between the contact pads 51' and the contact mask patterns 52', which are sequentially stacked.

Using the gate spacer 55", the gate spacer layer pattern 55', the contact mask pattern 52', and the gate mask pattern 52" as masks, impurity ions may be implanted into the semiconductor substrate. As a result, peripheral circuit source and drain regions 53 may be formed in the semiconductor substrate 5 of the peripheral circuit region P.

Figure 2L:
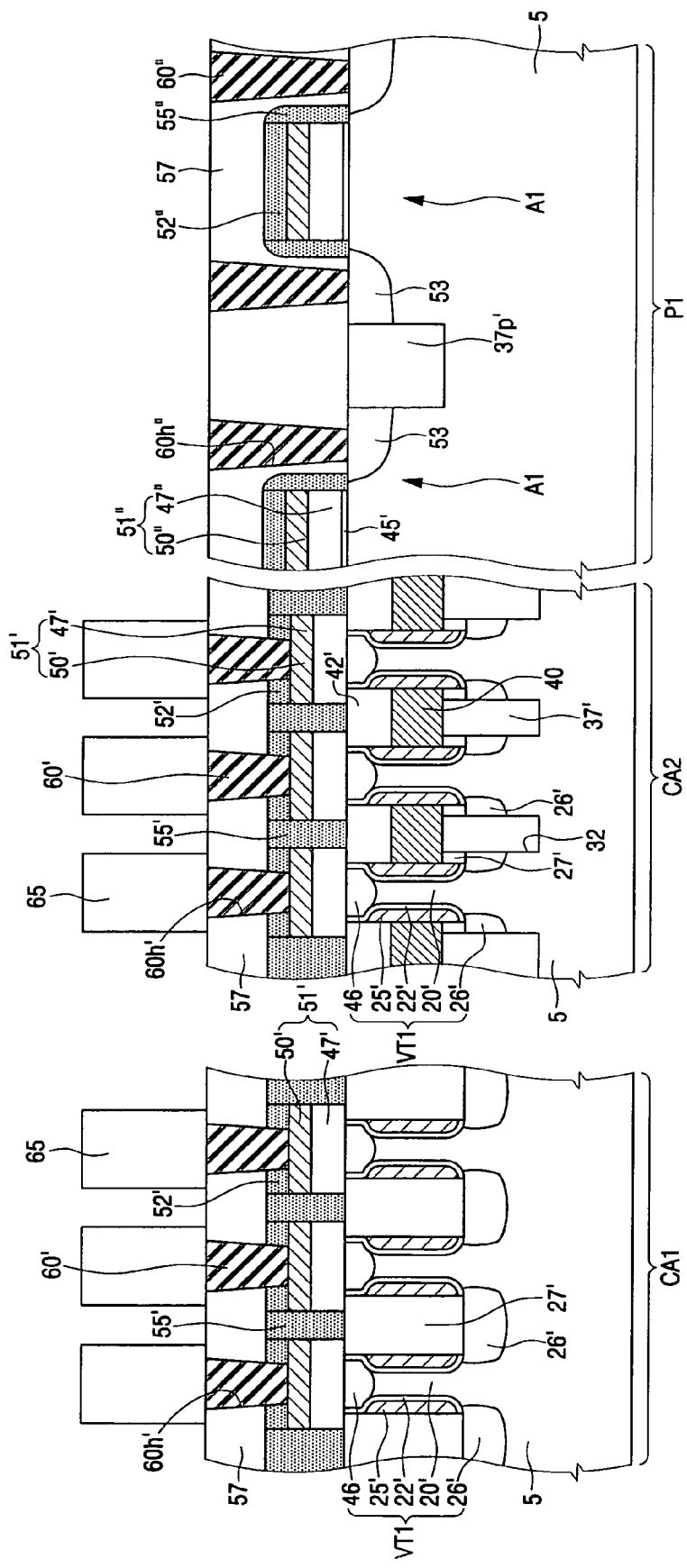

Referring to FIGS. 1 and 2L, a planarized interlayer insulating layer 57 may be formed on the substrate having the peripheral circuit source and drain regions 53. Buried contact holes 60h' exposing respective upper surfaces of the contact pads 51' are formed by sequentially penetrating the planarized interlayer insulating layer 57 and the contact mask pattern 52' of the cell region CA, and concurrently, peripheral circuit contact holes 60h" exposing the peripheral circuit source and drain regions 53 may be formed by penetrating the planarized interlayer insulating layer 57 of the peripheral circuit region P. Further, concurrently, as illustrated in FIG. 1, peripheral circuit gate contact holes 60h''' exposing respective upper surfaces of the peripheral circuit gate electrodes 51" may be formed by sequentially penetrating the planarized interlayer insulating layer 57 and the gate mask pattern 52" of the peripheral circuit region P.

Then, buried contact plugs 60', peripheral circuit contact plugs 60' and peripheral circuit gate contact plugs 60''' are formed to fill the buried contact holes 60h', the peripheral circuit contact holes 60h' and the peripheral circuit gate contact holes 60h''', respectively. Cell capacitors 65 electrically connected to the buried contact plugs 60' respectively may be formed on the substrate having the contact plugs.

FIG. 3 is a plan view illustrating a semiconductor device according to another embodiment of the present invention, and FIGS. 4A through 4E are sectional views taken along lines IV-IV', V-V', and VI-VI' of FIG. 3, illustrating steps in a process of fabricating the device of FIG. 3, according to one embodiment of the invention.

Reference characters of FIG. 3 'CA' and 'P' represent a cell region and a peripheral circuit region respectively, and reference characters of FIG. 4 'CA3', 'CA4' and 'P' represent sectional views taken along lines IV-IV', V-V' and VI-VI' of FIG. 3, respectively.

Referring to FIGS. 3 and 4A, a semiconductor substrate 105 having a cell region CA and a peripheral circuit region P is prepared. A mask layer is formed on the semiconductor substrate 105. The mask layer may be a silicon nitride layer. The mask layer is patterned, thereby forming a first mask pattern 110 having an island-shaped pattern two-dimensionally aligned along a row direction X and a column direction Y on the semiconductor substrate 105 of the cell region CA. The first mask pattern 110 of the peripheral circuit region P is formed to cover all the semiconductor substrate 105 of the peripheral circuit region P.

A distance W2 between the first mask patterns 110 in the column direction, and a distance W4 between the first mask patterns 110 in the row direction may be different. For example, the distance W4 between the first mask patterns 110 in the row direction may be two times the distance W2 between the first mask patterns 110 in the column direction. Further, a width W1 of the first mask pattern 110 in the column direction and a width W3 of the first mask pattern 110 in the row direction may be different. For example, the width W1 of the first mask pattern 110 in the column direction may be one and half times the width W3 of the first mask pattern 110 in the row direction.

Using the first mask pattern 110 as an etch mask, the semiconductor substrate 105 of the cell region CA is first etched, thereby forming a first trench 115t. Then, a conformal protecting layer 117 is formed on the first-etched semiconductor substrate. The protecting layer 117 may be a silicon nitride layer.

Figure 4B:
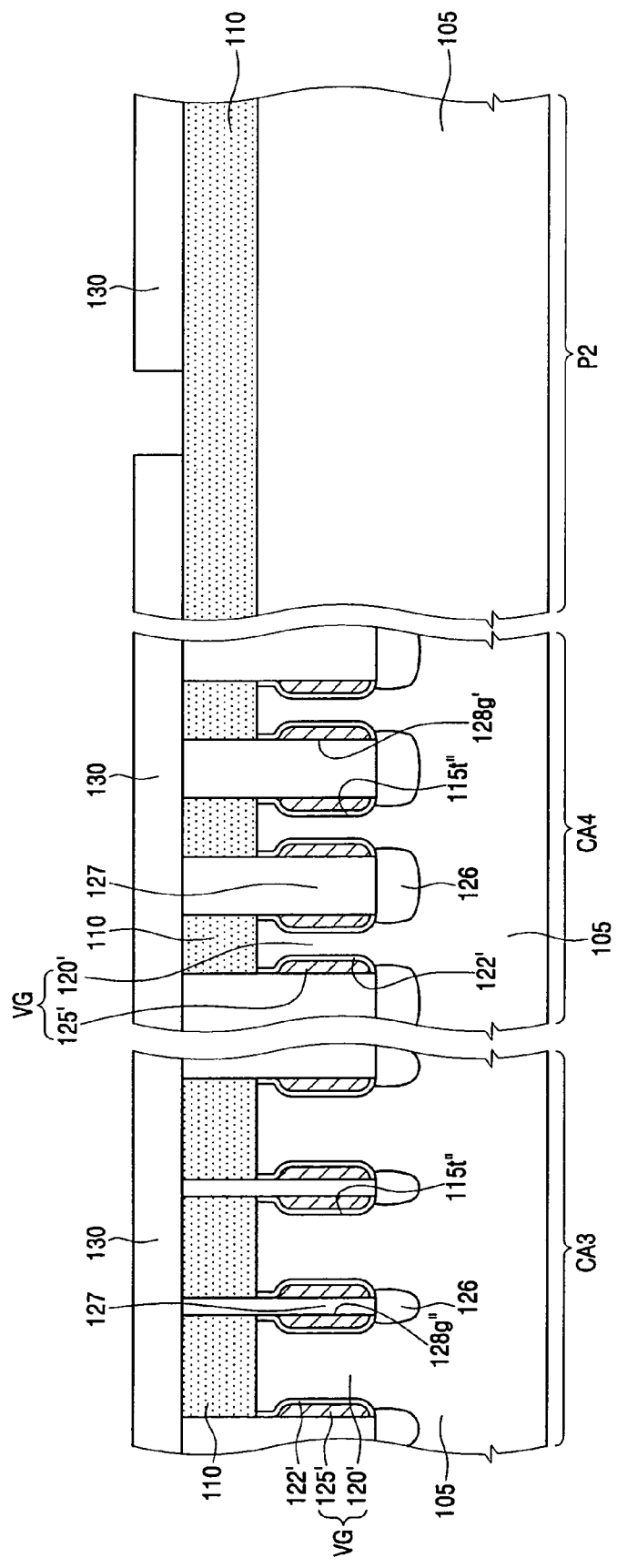

Referring to FIGS. 3 and 4B, processes are performed in the same way as described in reference to FIGS. 2B through 2D, thereby forming a semiconductor pillar 120', a third trench 115t41 a cell gate insulating layer 122', a cell gate electrode 125', and an impurity region 126. The semiconductor pillar 120' and the cell gate electrode 125' may constitute a vertical gate structure VG. A gap region between the vertical gate structures VG may be composed of a first gap region 128g' between the vertical gate structures VG aligned along the row direction, and a second gap region 128g" between the vertical gate structures VG aligned along the column direction.

Then, a mask insulating layer 127 may be formed to fill a portion between the first gap region 128g', the second gap region 128g" and the first mask patterns 110. A first photoresist layer is formed on the substrate having the mask insulating layer 127. The first photoresist layer is patterned, thereby forming a first photoresist pattern 130 covering the cell region CA, and exposing a predetermined portion of the first mask pattern 110 of the peripheral circuit region P.

Figure 4C:
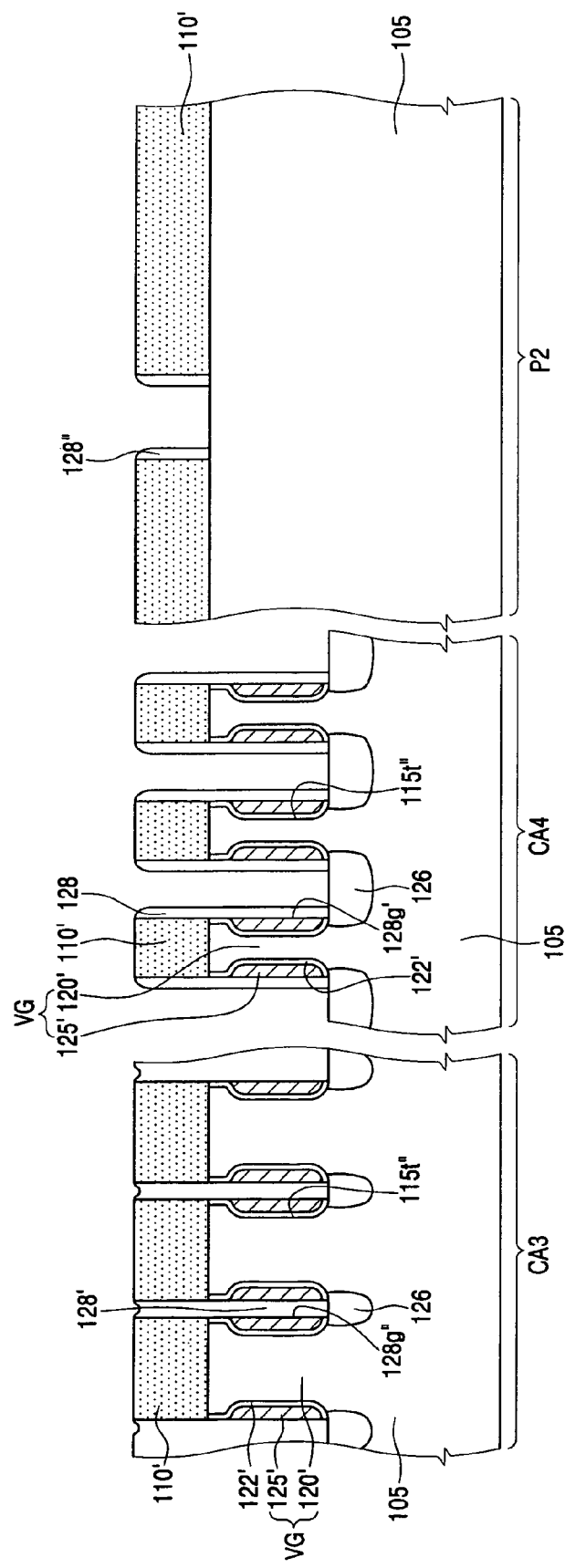

Referring to FIGS. 3 and 4C, the exposed first mask pattern 110 is etched using the first photoresist pattern 130 as an etch mask. As a result, a second mask pattern 110' is formed to expose a predetermined portion of the semiconductor substrate 105 of the peripheral circuit region P. Then, the first photoresist pattern 130 and the mask insulating layer 127 may be sequentially removed.

A spacer layer is formed on the substrate from which the mask insulating layer 127 is removed, and the spacer layer is formed to fill the second gap region 128g". Then, an etch-back process is performed on the substrate having the spacer layer, thereby forming a spacer 128 covering sidewalls of at least the first gap region 128g', and forming a spacer layer pattern 128' filling at least the second gap region 128g". Further, concurrently, a mask spacer 128g" is formed on a sidewall of the second mask pattern 110' of the peripheral circuit region.

Figure 4D:
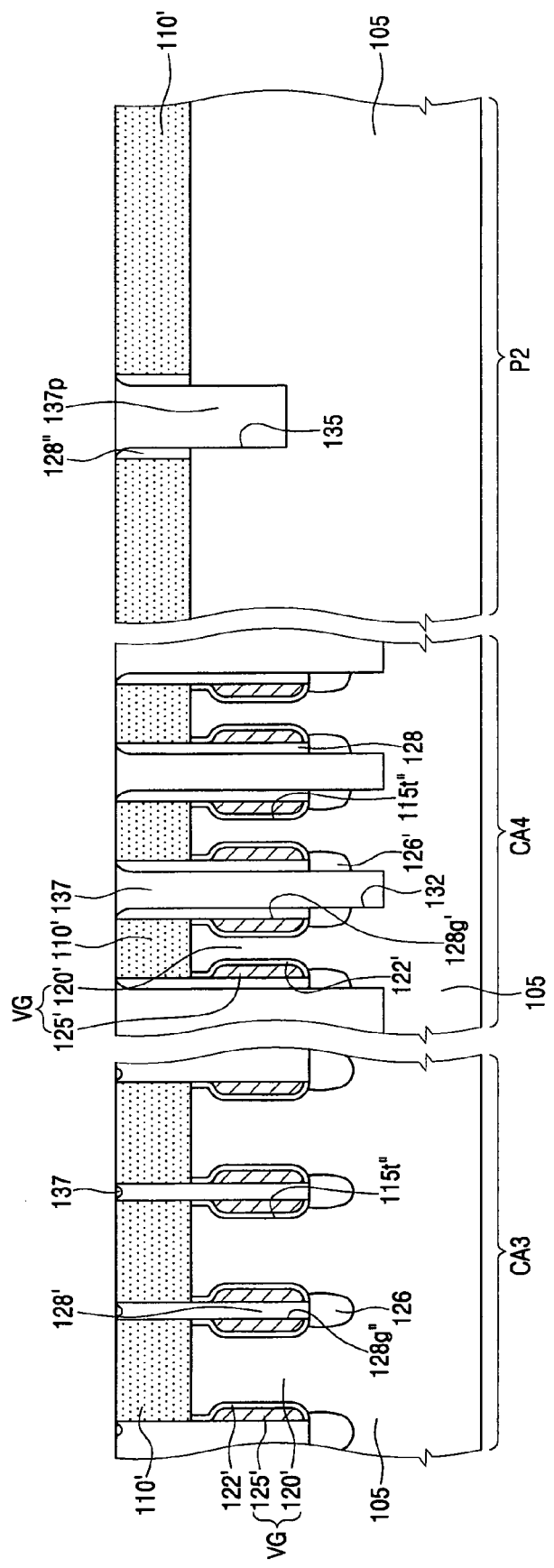

Referring to FIGS. 3 and 4D, using the second mask pattern 110', the spacers 128, the spacer layer pattern 128', and the mask spacer 128" as etch masks, the exposed semiconductor substrate 105 is etched. As a result, bit line separation trenches 132 are formed inside the semiconductor substrate below the first gap regions 128g', and a peripheral circuit trench 135 is formed in the peripheral circuit region P. The impurity region 126 of the cell region CA is separated by the bit line separation trenches 132, thereby forming drain regions 126'. The drain regions 126' function as bit lines.

After an isolation insulating layer is formed on the substrate having the drain regions 126', the isolation insulating layer is planarized until an upper surface of the second mask pattern 110' is exposed. As a result, a planarized isolation insulating layer 137 is formed in the cell region CA, and a peripheral circuit isolation layer 137p filling at least the peripheral circuit trench 135 is formed in the peripheral circuit region P. The isolation insulating layer may be the same material layer as that of the spacers 128. The isolation insulating layer may be a silicon oxide layer.

Figure 4E:
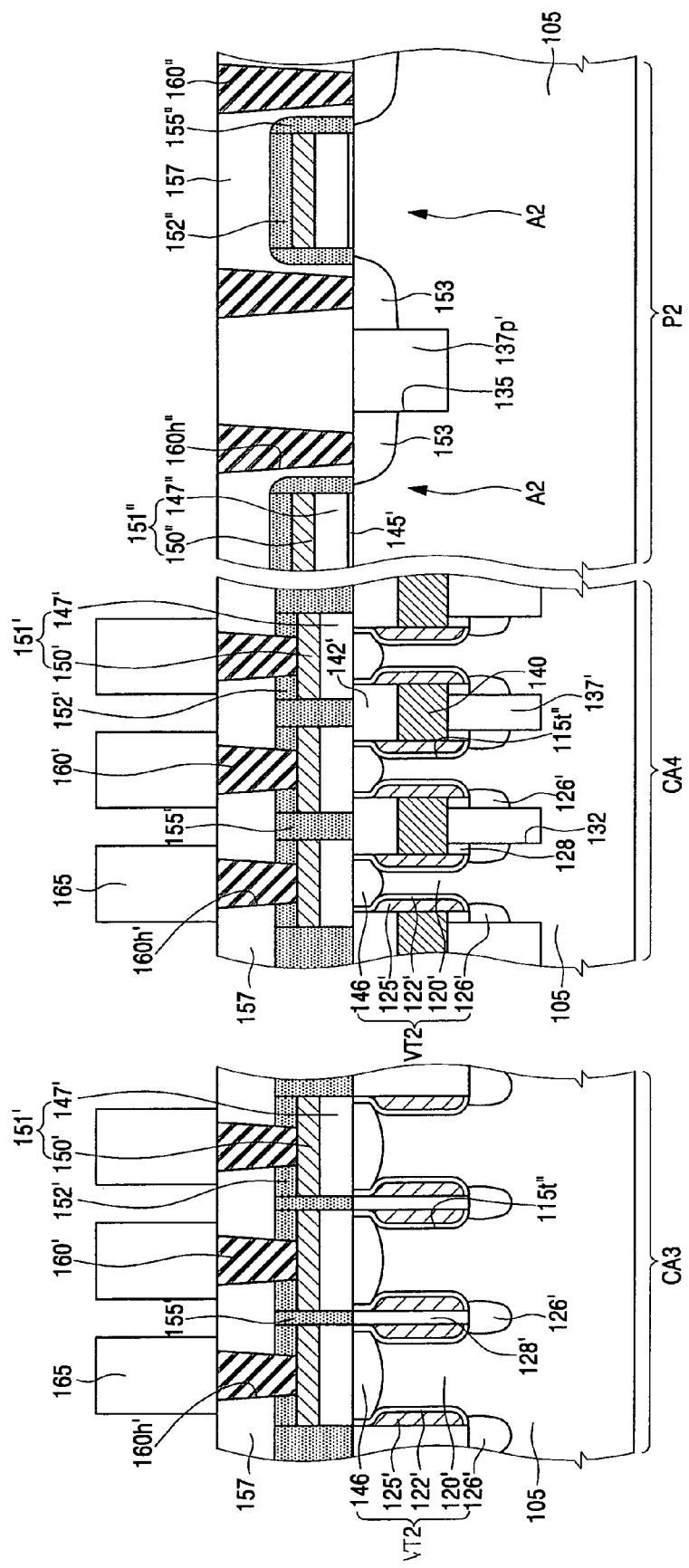

Referring to FIGS. 3 and 4E, processes are performed in the same way as described in reference to FIGS. 2G through 2L, thereby forming a bit line separation insulating layer 137', a word line 140, a planarized insulating layer 142, a final peripheral circuit isolation layer 137p' confining a peripheral circuit active region A2, and source regions 146. The second mask pattern 110' is removed.

The semiconductor pillar 120', the cell gate insulating layer 122', the cell gate electrode 125', the drain region 126', and the source region 146 may constitute a vertical transistor VT2. Since a voltage is applied to the cell gate electrode 125' via the word line 140, and a channel is vertically formed inside the semiconductor pillar 120' between the source and drain regions 146 and 126' with the cell gate insulating layer 122' disposed therebetween adjacent to the cell gate electrode 125', the vertical transistor VT2 may have its element characteristics as it is.

Then, a contact pad 151' and a contact mask pattern 152' are formed to sequentially cover upper surfaces of the vertical transistors VT2, and concurrently, a peripheral circuit gate insulating layer 145', a peripheral circuit gate electrode 151" and a gate mask pattern 152" may be sequentially formed on the semiconductor substrate 105 of the peripheral circuit region P. The contact pad 151' may be formed of a polysilicon pattern 147' and a metal silicide pattern 150', which are sequentially stacked. The metal silicide pattern 150' may be formed of a tungsten silicide pattern. The peripheral circuit gate electrode 151" may be formed of a polysilicon pattern 147" and a metal silicide pattern 150", which are sequentially stacked. The metal silicide pattern 150" may be formed of a tungsten silicide pattern.

A gate spacer 155" covering sidewalls of the peripheral circuit gate electrode 151" and the gate mask pattern 152", which are sequentially stacked, may be formed, and a gate spacer layer pattern 155' filling a portion between the contact pads 151' and the contact mask patterns 152', which are sequentially stacked, may be formed. Peripheral circuit source and drain regions 153 may be formed inside the peripheral circuit active region A2 at both sides of the peripheral circuit gate electrode 151" of the peripheral circuit region P. A planarized interlayer insulating layer 157 may be formed on the substrate having the peripheral circuit source and drain regions 153.

Buried contact holes 160h' exposing respective upper surfaces of the contact pads 151' may be formed by sequentially penetrating the planarized interlayer insulating layer 157 and the contact mask pattern 152' of the cell region CA, and concurrently, peripheral circuit contact holes 160h" exposing the peripheral circuit source and drain regions 153 may be formed by penetrating the planarized interlayer insulating layer 157 of the peripheral circuit region P. Concurrently, as illustrated in FIG. 3, peripheral circuit gate contact holes 160h'" exposing respective upper surfaces of the peripheral circuit gate electrodes 151" may be formed by sequentially penetrating the planarized interlayer insulating layer 157 and the gate mask pattern 152" of the peripheral circuit region P.

Then, buried contact plugs 160', peripheral circuit contact plugs 60", and the peripheral circuit gate contact plugs 160'" are formed to respectively fill the buried contact holes 160h', the peripheral circuit contact holes 160h", and the peripheral circuit gate contact holes 160h'". Cell capacitors 165 electrically connected to the buried contact plugs 160' respectively may be formed on the substrate having the contact plugs.

Hereinafter, a semiconductor device according to other embodiments of the present invention will be described with reference to FIGS. 1 and 2L. Reference characters of FIG. 1 'CA' and 'P' represent a cell region and a peripheral circuit region, respectively, and reference characters of FIG. 2L 'CA1', 'CA2' and 'P1' represent sectional views taken along lines I-I', II-II' and III-III' of FIG. 1, respectively.

Referring to FIGS. 1 and 2L, the semiconductor device includes a semiconductor substrate 5 having a cell region CA and a peripheral circuit region P. Island-shaped vertical transistors VT1 are disposed on the semiconductor substrate 5 of the cell region CA, and the vertical transistors VT1 are two-dimensionally aligned along a row direction X and a column direction Y. Each of the vertical transistors VT1 may include a semiconductor pillar 20', source and drain regions 46 and 26' respectively disposed inside an upper portion and a lower portion of the semiconductor pillar 20', a cell gate electrode 25' surrounding a center portion of the semiconductor pillar 20', and a cell gate insulating layer 22' interposed between the semiconductor pillar 20' and the cell gate electrode 25'.

A mask insulating layer pattern 27' may be disposed between the vertical transistors VT1 in the column direction. A bit line separation trench 32 is disposed inside the semiconductor substrate 5 below a gap region between the vertical transistors VT1, and the bit line separation trench 32 is disposed in parallel with the column direction of the vertical transistors VT1. A bit line separation insulating layer 37' may be disposed to fill the bit line separation trench 32 and to extend upwardly over the bit line separation trench 32. The mask insulating layer pattern 27' may be partially disposed between the bit line separation insulating layer 37' and the vertical transistors VT1. The drain regions 26' may be disposed to be separated by the bit line separation trench 32. The drain regions 26' may function as bit lines.

A word line 40 may be disposed on the bit line separation insulating layer 37' between the vertical transistors VT1 in contact with a sidewall of the cell gate electrode 25'. A planarized insulating layer 42' may be disposed between the vertical transistors VT1 on the word line 40.

A contact pad 51' and a contact mask pattern 52' may be sequentially disposed on each of the vertical transistors VT1. The contact pad 51' may be a polysilicon pattern 47' and a metal silicide pattern 50', which are sequentially stacked. The metal silicide pattern may be a tungsten silicide layer. The contact mask pattern 52' may be a silicon nitride layer.

A peripheral circuit isolation layer 37" may be disposed to confine the peripheral circuit active region A1 inside the semiconductor substrate of the peripheral circuit region P. A peripheral circuit gate electrode 51" and a gate mask pattern 52" may be sequentially disposed to cross the peripheral circuit active region A1 on the substrate of the peripheral circuit region P. The peripheral circuit gate electrode 51" may be the same material as that of the contact pad 51'. The peripheral circuit gate electrode 51" may be a polysilicon pattern 47" and a metal silicide pattern 50' which are sequentially stacked. The metal silicide pattern 50" may be a tungsten silicide layer. The gate mask pattern 52" may be a silicon nitride layer. A peripheral circuit gate insulating layer 45' may be interposed between the peripheral circuit active region A1 of the peripheral circuit region P and the peripheral circuit gate electrode 51". The peripheral circuit gate insulating layer 45' may be a silicon oxide layer.

A gate spacer 55" covering sidewalls of the peripheral circuit gate electrode 51" and the gate mask pattern 52' which are sequentially stacked, may be deposited, and a gate spacer layer pattern 55' filling a portion between the contact pads 51' and the contact mask patterns 52', which are sequentially stacked, may be deposed. Peripheral circuit source and drain regions 53 may be deposed inside the peripheral circuit active region A1 at both sides of the peripheral circuit gate electrode 51".

An interlayer insulating layer 57 may be disposed on the substrate having the contact pad 51' and the peripheral circuit gate electrode 51". Buried contact holes 60h' exposing respective upper surfaces of the contact pads 51' may be disposed by sequentially penetrating the interlayer insulating layer 57 and the contact mask pattern 52' of the cell region CA. Peripheral circuit contact holes 60h" exposing the peripheral circuit source and drain regions 53 through the interlayer insulating layer 57 of the peripheral circuit region P may be disposed. As illustrated in FIG. 1, peripheral circuit gate contact holes 60h''' may be disposed to sequentially penetrate the interlayer insulating layer 57 and the gate mask pattern 52" of the peripheral circuit region P, and expose respective upper surfaces of the peripheral circuit gate electrodes 51".

A buried contact plugs 60', peripheral circuit contact plugs 60", and the peripheral circuit gate contact plugs 60''' may be deposed to respectively fill the buried contact holes 60h', the peripheral circuit contact holes 60h", and the peripheral circuit gate contact holes 60h'''. Cell capacitors 65 electrically connected to the buried contact plugs 60' respectively may be deposed on the substrate having the contact plugs.

As described above, according to the present invention, the number of processes performed to form a vertical transistor and a planar transistor in a cell region and a peripheral circuit region respectively can be reduced by forming a bit line separation trench of the cell region and forming a peripheral circuit trench confining a peripheral circuit active region of the peripheral circuit region concurrently, and by forming a contact pad of the cell region and forming a peripheral circuit gate electrode of the peripheral circuit region concurrently. Furthermore, when a buried contact plug of the cell region is formed, and peripheral circuit contact plugs and peripheral circuit gate contact plugs electrically connected to source and drain regions of the peripheral circuit region can be formed concurrently. Therefore, since processing operations can be shortened, fabrication costs of semiconductor devices can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:
    preparing a semiconductor substrate comprising a cell region and a peripheral circuit region;
    forming island-shaped vertical gate structures two-dimensionally aligned along a row direction and a column direction on the substrate of the cell region, each of the vertical gate structures comprising a semiconductor pillar having a concave portion formed in a sidewall of the semiconductor pillar and a cell gate electrode surrounding a center portion of the semiconductor pillar in the concave portion of the semiconductor pillar;
    simultaneously forming a bit line separation trench inside the semiconductor substrate below a gap region between the vertical gate structures and a peripheral circuit trench confining a peripheral circuit active region inside the semiconductor substrate of the peripheral circuit region, in which the bit line separation trench is formed in parallel with the column direction of the vertical gate structures;
    forming a bit line separation insulating layer and a peripheral circuit isolation layer inside the bit line separation trench and the peripheral circuit trench, respectively; and
    forming a word line on the bit line separation insulating layer along the row direction of the vertical gate structures, the word line being formed to contact a portion of a sidewall of the cell gate electrode and expose a remaining portion of the sidewall of the cell gate electrode in the column direction of the vertical gate structures and to electrically connect two neighboring vertical gate structures.

2. The method according to claim 1, wherein the forming of the vertical gate structures comprises:
    etching the semiconductor substrate of the cell region by a predetermined depth, thereby forming island-shaped preliminary semiconductor pillars respectively corresponding to the vertical gate structures;
    isotropically etching lower portions of the preliminary semiconductor pillars selectively, thereby forming the semiconductor pillar corresponding to each of the vertical gate structures, an upper width of the semiconductor pillar being greater than a lower width thereof thereby forming the concave portion;
    forming a cell gate electrode layer filling a gap region between the semiconductor pillar and a neighboring semiconductor pillar; and
    unisotropically etching the cell gate electrode layer, thereby forming the cell gate electrode corresponding to each of the semiconductor pillars.

3. The method according to claim 1, before forming the bit line separation trench and the peripheral circuit trench, the method further comprising forming an impurity region inside the semiconductor substrate below the gap region between the vertical gate structures of the cell region, in which the impurity region is separated by the bit line separation trench during the formation of the bit line separation trench and the peripheral circuit trench, thereby forming a drain region.

4. The method according to claim 1, before forming the vertical gate structures, the method further comprising forming a surface impurity region on a surface of the semiconductor substrate of the cell region, in which the surface impurity region is separated during the formation of the vertical gate structures, and remaining inside upper portions of the vertical gate structures so as to function as a source region.

5. The method according to claim 1, after forming the word line, the method further comprising forming a source region inside an upper portion of the semiconductor pillar.

6. The method according to claim 1, wherein the gap region between the vertical gate structures comprises a first gap region between the vertical gate structures aligned along the row direction and a second gap region between the vertical gate structures aligned along the column direction, and the first gap region is formed to have a greater width than that of the second gap region.

7. The method according to claim 6, wherein the forming of the bit line separation trench and the peripheral circuit trench comprises:
    forming a spacer covering sidewalls of the first gap region, and a spacer layer pattern filling the second gap region; and etching the semiconductor substrate below the first gap region on which the spacer is formed and a predetermined portion of the semiconductor substrate of the peripheral circuit region.

8. The method according to claim 7, wherein the forming of the bit line separation insulating layer and the peripheral circuit isolation layer comprises:
   forming an isolation insulating layer on the substrate having the bit line separation trench and the peripheral circuit trench;
   planarizing the isolation insulating layer until upper surfaces of the vertical gate structures and an upper surface of the semiconductor substrate of the peripheral circuit region are exposed, thereby forming a peripheral circuit isolation layer in the peripheral circuit region; and
   selectively etching the planarized isolation insulating layer on the bit line separation trench and the spacer, thereby forming a bit line separation insulating layer covering the bit line separation trench and extending to a portion between the vertical gate structures.

9. The method according to claim 1, wherein the forming of the bit line separation trench and the peripheral circuit trench comprises:
   forming a mask insulating layer filling a gap region between the vertical gate structures;
   selectively etching the mask insulating layer, thereby forming a mask insulating layer groove exposing the semiconductor substrate below the gap region between the vertical gate structures in a column direction; and
   etching the semiconductor substrate exposed by the mask insulating layer groove and a predetermined portion of the semiconductor substrate of the peripheral circuit region.

10. The method according to claim 9, wherein the forming of the bit line separation insulating layer and the peripheral circuit isolation layer comprises:
    forming an isolation insulating layer on the substrate having the bit line separation trench and the peripheral circuit trench;
    planarizing the isolation insulating layer until upper surfaces of the vertical gate structures and an upper surface of the semiconductor substrate of the peripheral circuit region are exposed, thereby forming a peripheral circuit isolation layer in the peripheral circuit region; and
    selectively etching the planarized isolation insulating layer and the mask insulating layer on the bit line separation trench, thereby forming a bit line separation insulating layer covering the bit line separation trench, and extending to and filling a predetermined portion between the vertical gate structures.

11. The method according to claim 1, wherein the bit line separation trench is formed to have a smaller width than a distance between the vertical gate structures aligned along the row direction.

12. The method according to claim 1, after forming the word line, the method further comprising:
    forming an insulating layer on the word line to fill the gap region between the vertical gate structures;
    forming a conductive layer on the substrate having the insulating layer; and
    patterning the conductive layer, thereby forming contact pads covering respective upper surfaces of the vertical gate structures, and a peripheral circuit gate electrode crossing the peripheral circuit active region on the semiconductor substrate of the peripheral circuit region.

13. The method according to claim 12, further comprising implanting impurity ions into the semiconductor substrate, using the contact pads and the peripheral circuit gate electrode as ion implantation masks, thereby forming peripheral circuit source and drain regions inside the semiconductor substrate of the peripheral circuit region.

14. The method according to claim 13, further comprising:
    forming an interlayer insulating layer on the substrate having the peripheral circuit source and drain regions; and
    forming buried contact plugs and peripheral circuit contact plugs through the interlayer insulating layer so as to be electrically connected to the contact pads and the peripheral circuit source and drain regions, respectively.

15. The method according to claim 14, further comprising forming cell capacitors electrically connected to the buried contact plugs respectively on the substrate having the buried contact plugs.

* * * * *